US012658918B2

(12) United States Patent
Ma et al.

(10) Patent No.: US 12,658,918 B2
(45) Date of Patent: Jun. 16, 2026

(54) DATA TRANSFER AND BUS STRUCTURE

(71) Applicants: TSMC Nanjing Company Limited, Nanjing (CN); TAIWAN SEMICONDUCTOR MANUFACTURING COMPANY, LTD., Hsinchu (TW)

(72) Inventors: Haibei Ma, Nanjing City (CN); Zixuan Zhang, Nanjing City (CN); Hua Li, Nanjing City (CN); YuCheng Zhou, Nanjing City (CN); Yi-Ting Chen, Hsinchu County (TW)

(73) Assignees: TSMC NANJING COMPANY LIMITED, Nanjing (CN); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 48 days.

(21) Appl. No.: 18/940,178

(22) Filed: Nov. 7, 2024

(65) Prior Publication Data

US 2026/0113039 A1 Apr. 23, 2026

(30) Foreign Application Priority Data

Oct. 22, 2024 (CN) .......................... 202422555631.1

(51) Int. Cl.
H03K 19/0175 (2006.01)
H03K 19/20 (2006.01)
(52) U.S. Cl.
CPC ..... H03K 19/017509 (2013.01); H03K 19/20 (2013.01)

(58) Field of Classification Search
CPC . H03K 19/173; H03K 19/177; H03K 19/1736
See application file for complete search history.

(56) References Cited

U.S. PATENT DOCUMENTS

| | | | | | |
|---|---|---|---|---|---|
| 5,548,596 | A | * | 8/1996 | Tobita | G11C 29/34 |
| | | | | | 714/719 |
| 5,912,899 | A | * | 6/1999 | Kim | G11C 29/12 |
| | | | | | 365/201 |
| 6,052,320 | A | * | 4/2000 | Kwak | G11C 29/28 |
| | | | | | 365/201 |
| 6,857,092 | B1 | * | 2/2005 | Fox | G01R 31/318516 |
| | | | | | 714/732 |
| 2015/0255338 | A1 | * | 9/2015 | Xiao | H10W 20/057 |
| | | | | | 438/641 |
| 2017/0364474 | A1 | * | 12/2017 | Noyes | G06F 15/7857 |
| 2018/0157779 | A1 | * | 6/2018 | Sakimura | G11C 7/22 |
| 2023/0315389 | A1 | * | 10/2023 | Fujiwara | G11C 11/419 |
| | | | | | 708/232 |

* cited by examiner

*Primary Examiner* — Jason M Crawford
(74) *Attorney, Agent, or Firm* — Birch, Stewart, Kolasch & Birch, LLP

(57) ABSTRACT

A device is provided, and includes a first bus; a first circuit and a first bus unit circuit, a second circuit and a second bus unit circuit. The first circuit is coupled to the first bus through the first bus unit circuit, and the first bus unit circuit passes a first output signal from the first circuit as a first bus data signal on the first bus. The second circuit is coupled to the first bus through the second bus unit circuit, and the second bus unit circuit performs an OR operation between the first bus data signal and a second bus data signal on the first bus to generate a first input signal to the second circuit.

20 Claims, 14 Drawing Sheets

14

ORI OR3 OR7
100c OR2 OR6
RdBUSL0
RdBUSR1
RdBUSL1
100b OR3 OR7
ORI OR2 OR6 OR4 OR5
AddrBUSR1
AddrBUSL0
AddrBUSL1
OR2 OR6
WrBUSR0 OR3 OR7 OR4 OR5
WrBUSR1
WrBUSL1
ORI
OR4 OR5 100a
ORI
100d OR4 OR5
110
120
P111 P112 P113 P114 P115 P116
P121 P122 P123 P124 P125 P126
WrBUSL0 SO111 SO112 SI111
SI121 SI122 SO121

ORI OR3 OR7
100f OR2 OR6 BUSH3
RdBUSR[n:0]
RdBUSL[n:0]
100e OR3 OR7 OR4 OR5 BUSH2
ORI OR2 OR6
AddrBUSR[n:0]
AddrBUSL[n:0]
BUSH1
WrBUSR[n:0]
WrBUSL[n:0]

master
slave

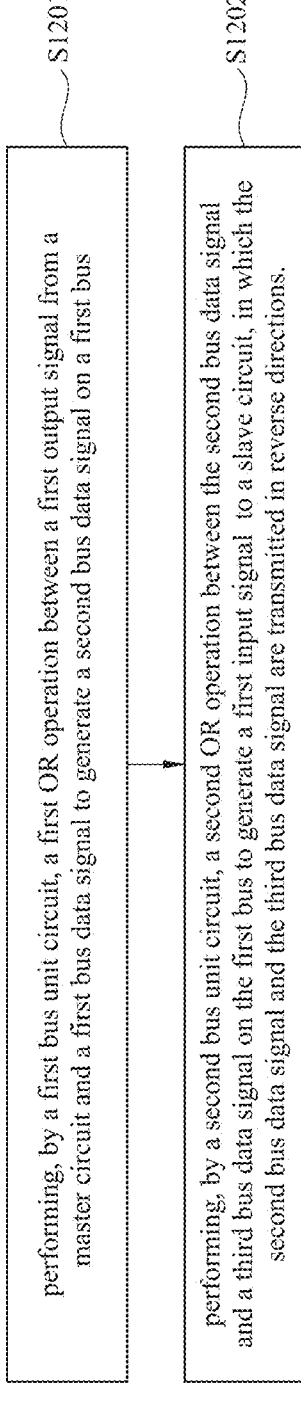

performing, by a first bus unit circuit, a first OR operation between a first output signal from a master circuit and a first bus data signal to generate a second bus data signal on a first bus ⟋S1201 performing, by a second bus unit circuit, a second OR operation between the second bus data signal and a third bus data signal on the first bus to generate a first input signal to a slave circuit, in which the second bus data signal and the third bus data signal are transmitted in reverse directions. ⟋S1202

1309 system design logic design synthesis pre-layout simulation placement & routing parameter extraction physical verification and signoff layout file generating fabricating stage

1300

DATA TRANSFER AND BUS STRUCTURE

CROSS REFERENCE

The present application claims priority to China Application Serial Number 202422555631.1 filed on Oct. 22, 2024, which is herein incorporated by reference in its entirety.

BACKGROUND

Certain methods relying on a tri-state buffer bus configuration encounter challenges related to electrical leaks and speed limitations. Managing the floating state of the bus demands precise control, potentially requiring multiple driving mechanisms with high current and timing complications as the number of elements and bus capacitance increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a flowchart diagram of a method, in accordance with some embodiments of the present disclosure.

DETAILED DESCRIPTION

Figure 1:
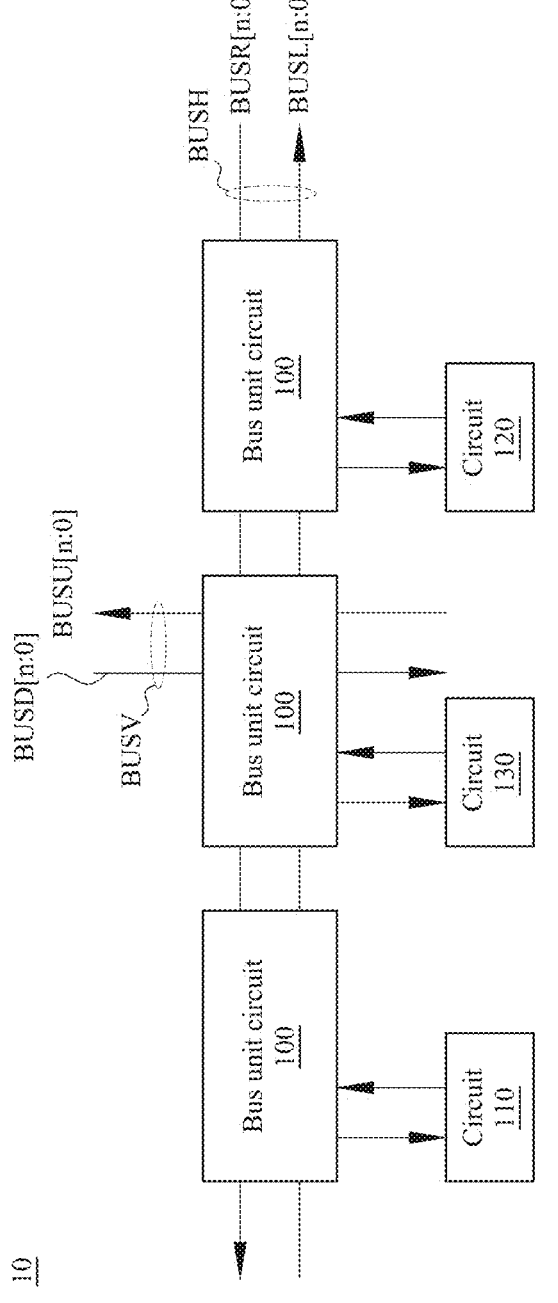
FIG. 1 is a schematic diagram of an integrated circuit, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Reference is now made to FIG. 1. FIG. 1 is a schematic diagram of an integrated circuit 10, in accordance with some embodiments of the present disclosure. For illustration, the integrated circuit 10 includes circuits 110, 120, 130, bus unit circuits 100 and buses BUSV and BUSH. The circuits 110-130 are coupled to the bus BUSH through one of the bus unit circuits 100 respectively. In some embodiments, each of the circuits 110-130 can be a device/circuit in a network-on-chip (NoC) system, a logic circuit (e.g., memory circuit, controller,) or any other suitable circuit.

In some embodiments, the circuits 110-130 are configured to communicate with each other on the bus BUSH through the bus unit circuits 100. The bus BUSH is configured for horizontal bidirectional transmission of at least two signals, for example, bus data signals BUSR and BUSL of n bits, n being positive number. As illustratively shown in FIG. 1, the bus data signals BUSR and BUSL are transmitted in reverses direction horizontally.

The bus BUSV is coupled to the bus BUSH through the bus unit circuit 100 and is configured for vertical bidirectional transmission of at least two signals, for example, bus data signals BUSD and BUSU of n bits. The bus data signals BUSD and BUSU are transmitted in reverses direction vertically.

In some embodiments of operations, the circuits 110-130 operate according to a master-slave protocol, for example, the circuit 110 being operating as a master circuit and the circuits 120-130 operating as two parallel slave circuits respectively. Specifically, for example, the circuit 110 controls the circuits 120-130 by transmitting signals to the bus BUSH through the bus unit circuit 100, and the bus unit circuit 100 passes one of the signals from the circuit 110 as the bus data signal BUSL to the circuits 120-130.

With the configurations of the bus BUSV, the circuit 110 is further configured to control other slave circuits (not shown) coupled to the bus BUSV by transmitting signals through the bus unit circuit 100 coupled to both the buses BUSV and BUSH.

The configurations of FIG. 1 are given for illustrative purposes. Various implements are within the contemplated scope of the present disclosure.

Figure 2:
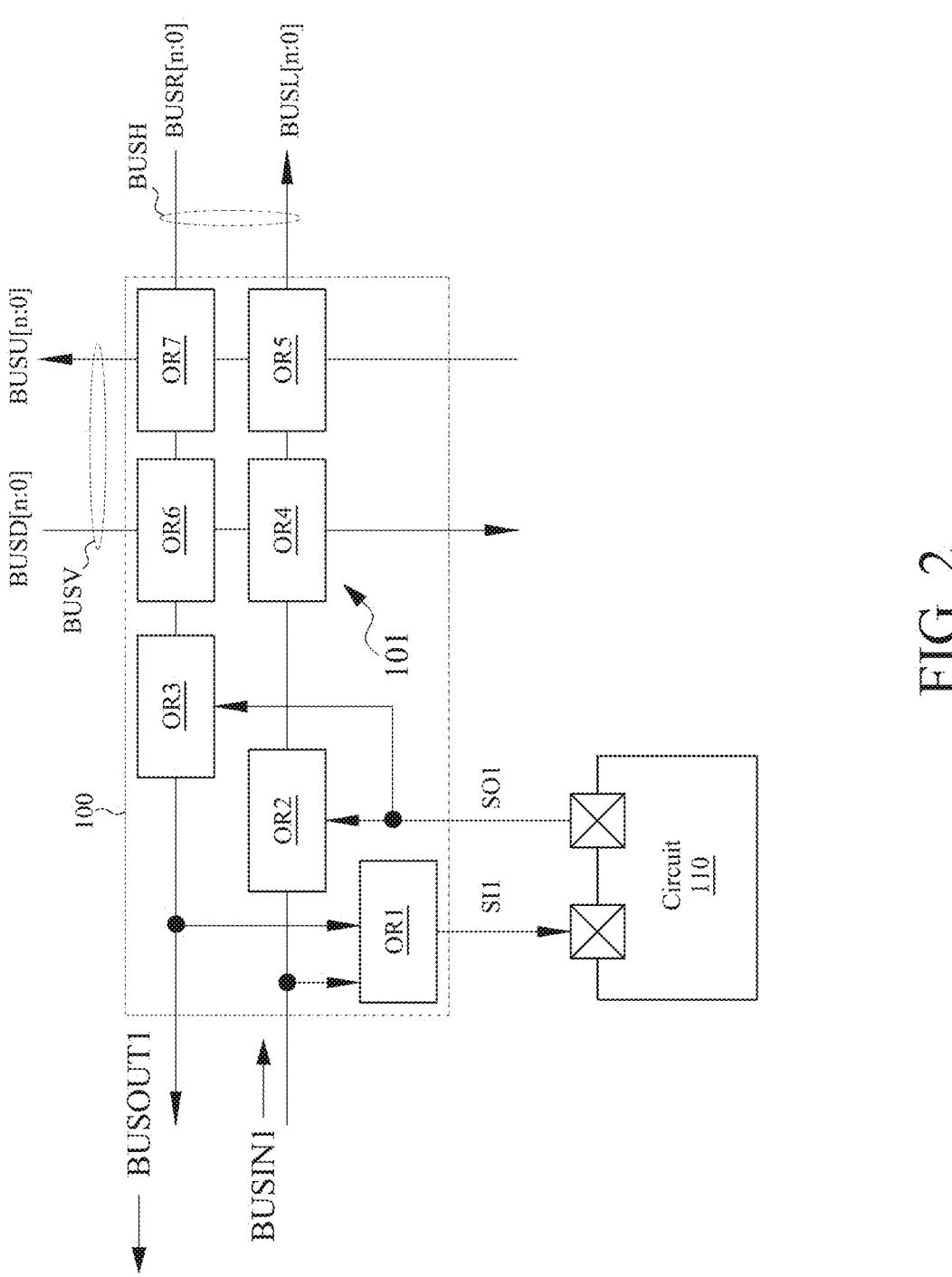
FIG. 2 is a schematic diagram of part of the integrated circuit corresponding to FIG. 1, in accordance with some embodiments of the present disclosure.

Reference is now made to FIG. 2. FIG. 2 is a schematic diagram of part of the integrated circuit 10 corresponding to FIG. 1, in accordance with some embodiments of the present disclosure.

As illustratively shown in FIG. 2, the bus unit circuit 100 includes OR gates OR1-OR7. The OR gate OR1 has two input terminals coupled to two signal lines of the bus BUSH. The OR gates OR2, OR4, and OR5 are coupled in series to a first signal line (e.g., transmitting the bus data signal BUSL) of the bus BUSH. The OR gates OR3, OR6, and OR7 are coupled in series to a second signal line (e.g., transmitting the bus data signal BUSR) of the bus BUSH. Furthermore, the OR gates OR4 and OR6 are coupled in series to a first signal line (e.g., transmitting the bus data signal BUSD) of the bus BUSV. The OR gates OR5 and OR7 are coupled in series to a second signal line (e.g., transmitting the bus data signal BUSU) of the bus BUSV.

In operation, the bus unit circuit 100 is configured to perform OR operation based on input signals on corresponding ones in the buses coupled thereto to generate corresponding bus data signals. For example, the circuit 110 transmits an output signal SO1 through a pin thereof and the OR gates OR2-OR3 in the bus unit circuit 100 to the bus BUSH. In some embodiments of the circuit 110 operating as a master circuit, a bus data signal BUSIN1 transmitted to the bus unit circuit 100 is set to have a low logic value (e.g., tied to a ground voltage.) The series-coupled OR gates OR2, OR4-OR5 are configured to perform OR operations, and correspondingly the bus data signal BUSL is determined by and equal to the output signal SO1. Specifically, the OR gate OR2 performs OR operation between the bus data signal BUSIN1 and the output signal SO1 to output a signal to the OR gate OR4. The OR gate OR4 performs OR operation between signal transmitted from the OR gate OR6 and the signal output from the OR gate OR2 to generate output signals to the OR gate OR5 and on signal line of the bus BUSV. The OR gate OR5 performs OR operation between the output signal from the OR gate OR4 and signal transmitted on the second signal line of the bus BUSV (e.g., the bus data signal BUSU) to generate the bus data signal BUSL on the first signal line of the bus BUSH and to the second signal line of the bus BUSV.

Continued reference to FIG. 2, the OR gate OR7 performs OR operation between signal transmitted from the OR gate OR5 and the bus data signal BUSR to generate output signals to the OR gate OR6 and on second signal line (e.g., transmitting the bus data signal BUSU) of the bus BUSV. The OR gate OR6 performs OR operation between the output signal from the OR gate OR7 and signal transmitted on the first signal line of the bus BUSV (e.g., the bus data signal BUSD) to generate signal to the OR gate OR3. The OR gate OR3 performs OR operation between the signal from the OR gate OR6 and the output signal SO1 to output a bus data signal BUSOUT1.

Based on the embodiments of FIG. 2, the OR gates OR4-OR7 are included in a logic circuit 101 of the bus unit circuit 100. The logic circuit 101 is coupled to both bus BUSH and BUSV and configured to transmit signals on the bus BUSH/BUSV to the bus BUSV/BUSH.

Figure 3:
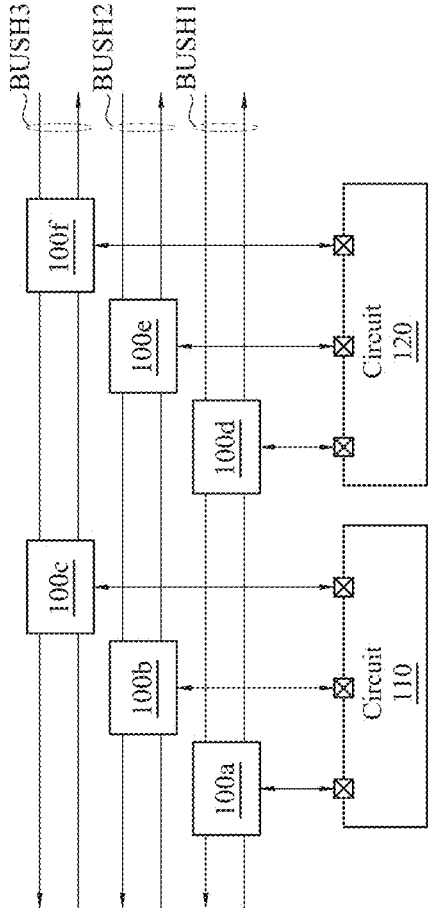
FIG. 3 is a schematic diagram of an integrated circuit, in accordance with some embodiments of the present disclosure.

Reference is now made to FIG. 3. FIG. 3 is a schematic diagram of an integrated circuit 13, in accordance with some embodiments of the present disclosure. With respect to the embodiments of FIGS. 1-2, like elements in FIG. 3 are designated with the same reference numbers for ease of understanding. The specific operations of similar elements, which are already discussed in detail in above paragraphs, are omitted herein for the sake of brevity.

As illustratively shown in FIG. 3, the circuit 110 is coupled to buses BUSH1-BUSH3 through bus unit circuits 100a-100c separately. The circuit 120 is coupled to the buses BUSH1-BUSH3 through bus unit circuits 100d-100f separately. In some embodiments, the bus unit circuits 100a-100f are configured with respect to, for example, the bus unit circuit 100 of FIGS. 1-2. The buses BUSH1-BUSH3 are configured with respect to, for example, the bus BUSH of FIGS. 1-2.

In some embodiments, each of the bus unit circuits 100a-100f is configured to perform OR operation based on input signals on corresponding ones in the buses BUSH1-BUSH3 coupled thereto to generate corresponding bus data signals to the circuit 110 and the circuit 120.

Figure 4:
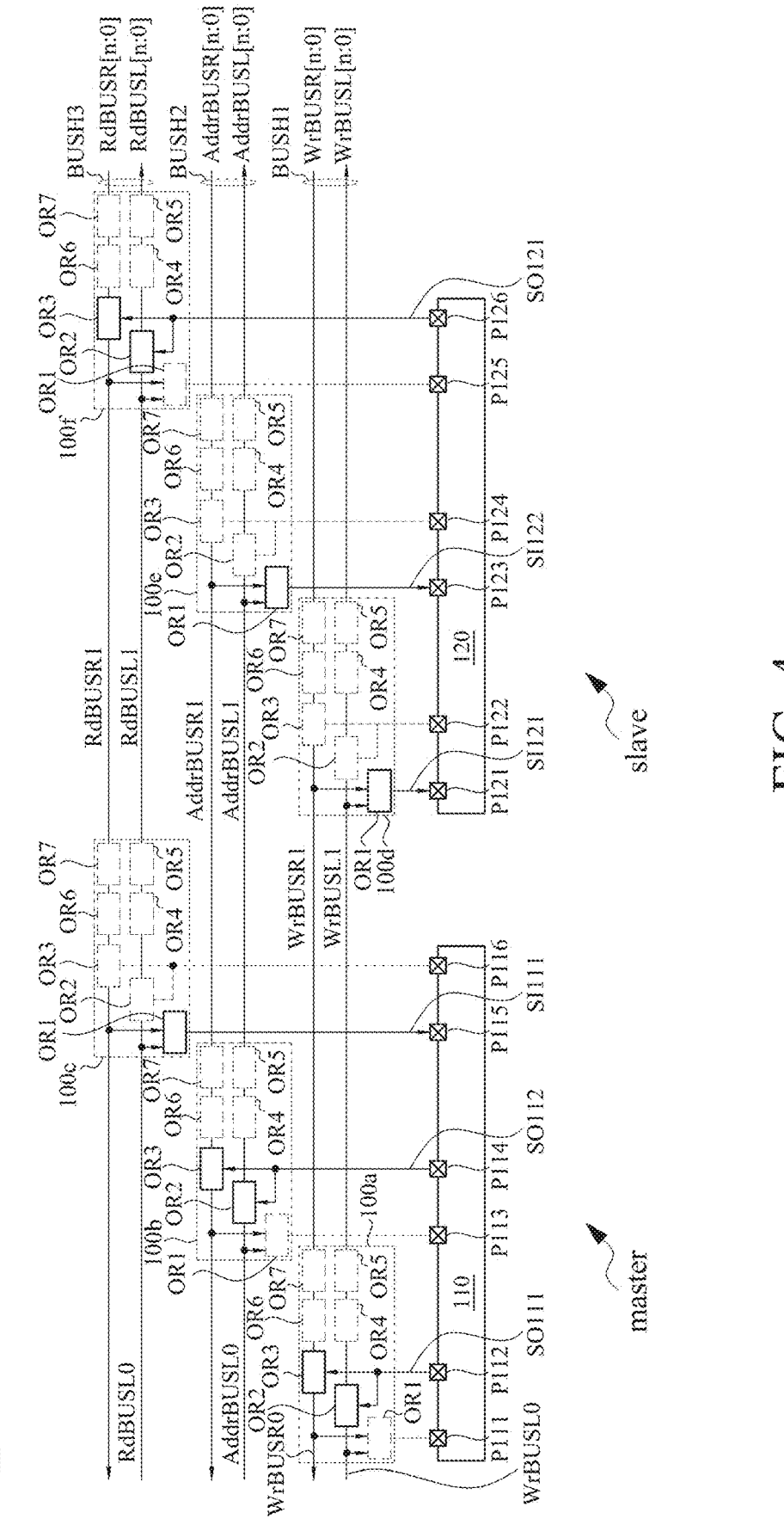
FIG. 4 is a schematic diagram of an integrated circuit, in accordance with some embodiments of the present disclosure.

Reference is now made to FIG. 4. FIG. 4 is a schematic diagram of an integrated circuit 14, in accordance with some embodiments of the present disclosure. In some embodiments, the integrated circuit 14 is configured with respect to, for example, the integrated circuit 13 of FIG. 3.

For illustration, each of the buses BUSH1-BUSH3 includes two signal lines. The bus BUSH1 is configured for horizontal bidirectional transmission of at least two signals, for example, bus data signals WrBUSL-WrBUSR of n bits. The bus BUSH2 is configured for horizontal bidirectional transmission of at least two signals, for example, bus data signals AddrBUSL-AddrBUSR of n bits. The bus BUSH3 is configured for horizontal bidirectional transmission of at least two signals, for example, bus data signals RdBUSL-RdBUSR of n bits.

In some embodiments, transactions on the buses typically consist of a start event, a destination slave address in address bus data signals (e.g., corresponding to AddrBUSL-AddrBUSR), a read/write data in read/write bus data signals (e.g., RdBUSL-RdBUSR/WrBUSL-WrBUSR) for circuits on the buses to access other circuits coupled to the buses. In some embodiments, the transactions are generally terminated by a stop event or another start event.

The circuit 110 is coupled to the bus unit circuit 100a through pins P111-P112 and further to the bus BUSH1, in which an output terminal of the OR gate OR1 of the bus unit circuit 100a is coupled to the pin 111 and input terminals of the OR gates OR2-OR3 of the bus unit circuit 100a are coupled to the pin 112. The circuit 110 is coupled to the bus unit circuit 100b through pins P113-P114 and further to the bus BUSH2, in which an output terminal of the OR gate OR1 of the bus unit circuit 100b is coupled to the pin 113 and input terminals of the OR gates OR2-OR3 of the bus unit circuit 100b are coupled to the pin 114. The circuit 110 is coupled to the bus unit circuit 100c through pins P115-P116 and further to the bus BUSH3, in which an output terminal of the OR gate OR1 of the bus unit circuit 100c is coupled to the pin 115 and input terminals of the OR gates OR2-OR3 of the bus unit circuit 100c are coupled to the pin 116.

Similarly, the circuit 120 is coupled to the bus unit circuit 100d through pins P121-P122 and further to the bus BUSH1, in which an output terminal of the OR gate OR1 of the bus unit circuit 100d is coupled to the pin 121 and input terminals of the OR gates OR2-OR3 of the bus unit circuit 100d are coupled to the pin 122. The circuit 120 is coupled to the bus unit circuit 100e through pins P123-P124 and further to the bus BUSH2, in which an output terminal of the OR gate OR1 of the bus unit circuit 100e is coupled to the pin 123 and input terminals of the OR gates OR2-OR3 of the bus unit circuit 100e are coupled to the pin 124. The circuit 120 is coupled to the bus unit circuit 100f through pins P125-P126 and further to the bus BUSH3, in which an output terminal of the OR gate OR1 of the bus unit circuit 100f is coupled to the pin 125 and input terminals of the OR gates OR2-OR3 of the bus unit circuit 100f are coupled to the pin 126.

In the embodiments of FIG. 4, according to a first master-slave protocol, the circuits 110 and 120 operate as the master circuit and the slave circuit respectively. In some embodiments, the circuit 110 controls the circuit 120 by transmitting signals to the circuit 120 through the bus BUSH1-BUSH2, and receives feedback signals from the circuit 120 through the bus BUSH3. Accordingly, for the signals on the first signal lines (corresponding to the ones transmitting signals rightward) of the buses BUSH1-BUSH2 to be determined by and equal to the signal from the circuit 110, bus data signals WrBUSL0 and AddrBUSL0 transmitted to the bus unit circuits 100a and 100b are configured with respect to, for example, the BUSIN1 of FIG. 2 and set to have the low logic value (e.g., tied to a ground voltage.) Similarly, for the signals on the second signal line (corresponding to the one transmitting signals leftward) of the bus BUSH3 to be determined by and equal to the signal output from the circuit 120, the bus data signal RdBUSR transmitted to the bus unit circuit 100f is set to have the low logic value (e.g., tied to a ground voltage.)

In operation, the circuit 110 operating as the master circuit to firstly transmit output signals SO111-SO112 to the OR gates OR2-OR3 in the bus unit circuits 100a-100b, while output terminals of the OR gates OR1 in the bus unit circuits 100a-100b are tied to "0" and the circuit 110 does not receive signals from the buses BUSH1-BUSH2. The OR gates OR2-OR3 are referred to as "operating OR gates" and depicted by solid lines. Furthermore, the OR gates OR4-OR7 in the bus unit circuits 100a-100b are referred to as "pass OR gates" and depicted by dash lines. Specifically, due to no vertical bus communication, first input terminals of the OR gates OR4-OR7 in the bus unit circuits 100a-100b that are coupled to the vertical bus are tied to ground. Accordingly, output signals of the OR gates OR4-OR7 follow signals received from second input terminals of the OR gates OR4-OR7. For example, the OR gates OR4-OR5 pass and output the signal from the OR gate OR2, and the OR gates OR6-OR7 pass and output the signal received by the OR gate OR7.

Continued to the above embodiments, the bus unit circuits 100a-110b further pass the output signals SO111-SO112 from the circuit 110 as a bus data signal WrBUSL1 and a bus data signal AddrBUSL1 on the buses BUSH1-BUSH2 to the bus unit circuits 100d-100e separately and further to the circuit 120.

Specifically, for example, the OR gate OR2 of the bus unit circuit 100a performs an OR operation between the output signal SO111 and the bus data signal WrBUSL0 having the low logic value to output the bus data signal WrBUSL1 through the OR gates OR4-OR5 of the bus unit circuit 100a. The bus data signal WrBUSL1 follows and equals to the output signal SO111. Then, the OR gate OR1 of the bus unit circuit 100d performs an OR operation between the bus data signal WrBUSL1 and a bus data signal WrBUSR1 on the bus BUSH1 to generate an input signal SI121 to the circuit 120 at the pin P121, the bus data signal WrBUSR1 having the low logic value. In some embodiments, the OR gates OR2-OR7 of the bus unit circuit 100d operate as pass OR gates that output signals of the OR gates OR2-OR7 follow signals received from input terminals of the OR gates OR2-OR7, while the other input terminals of the gates OR2-OR7 are tied to ground. For example, the pin P122 is tied to ground and no vertical transmission through the OR gates OR4-OR7. Accordingly, the bus data signal WrBUSL1 equal to the WrBUSL, and the data signal WrBUSLR1 equal to the WrBUSLR.

Similarly, the OR gate OR2 of the bus unit circuit 100b performs an OR operation between the output signal SO112 and the bus data signal AddrBUSL0 having the low logic value to output the bus data signal AddrBUSL1 through the OR gates OR4-OR5 of the bus unit circuit 100b. The bus data signal AddrBUSL1 follows and equals to the output signal SO112. Then, the OR gate OR1 of the bus unit circuit 100e performs an OR operation between the bus data signal AddrBUSL1 and a bus data signal AddrBUSR1 on the bus BUSH2 to generate an input signal SI122 to the circuit 120 at the pin P123, the bus data signal AddrBUSR1 having the low logic value. In some embodiments, the OR gates OR2-OR7 of the bus unit circuit 100e operate as the pass OR gates, while the pin P124 is tied to ground and no vertical transmission through the OR gates OR4-OR7 of the bus unit circuit 100e. Accordingly, the bus data signal AddrBUSL1 equal to the AddrBUSL, and the data signal AddrBUSLR1 equal to the AddrBUSLR.

The circuit 120 operating as the slave circuit to transmit output signal, for example, SO121 to the OR gates OR2-OR3 in the bus unit circuit 100f, while the circuit 120 selectively receives the signal from the OR gate OR1 in the bus unit circuit 100f coupled to the pin P125 according to the operational configurations of the circuit 120. In some embodiments, the circuit 120 does not receive signals from the bus BUSH3, in some configurations of, for example, by tying the pin P125 to "0". The OR gates OR2-OR3 in the bus unit circuit 100f are referred to as "operating OR gates." Furthermore, the OR gates OR4-OR7 in the bus unit circuit 100f are referred to as the pass OR gates. Specifically, due to no vertical bus communication, first input terminals of the OR gates OR4-OR7 in the bus unit circuit 100f that are coupled to the vertical bus are tied to ground. The configurations of the OR gates OR4-OR7 in the bus unit circuit 100f are similar to the OR gates OR4-OR7 in the bus unit circuits 100a-100b. Hence, the repetitious descriptions are omitted here.

Continued to the above embodiments, the bus unit circuit 100f further passes the output signal SO121 from the circuit 120 as a bus data signal RdBUSR1 on the bus BUSH3 to the bus unit circuit 100c and further to the circuit 110.

Specifically, for example, the OR gate OR3 of the bus unit circuit 100f performs an OR operation between the output signal SO121 and the bus data signal RdBUSR having the low logic value to output the bus data signal RdBUSR1 being transmitted leftward. The bus data signal RdBUSR1 follows and equals to the output signal SO121. Then, the OR gate OR1 of the bus unit circuit 100c performs an OR operation between the bus data signal RdBUSR1 and a bus data signal RdBUSL0 on the bus BUSH3 to generate an input signal SI111 to the circuit 110 at the pin P115, the bus data signal RdBUSL0 having the low logic value. In some embodiments, the OR gates OR2-OR7 of the bus unit circuit 100c operate as pass OR gates that output signals of the OR gates OR2-OR7 follow signals received from input terminals of the OR gates OR2-OR7, while the other input terminals of the OR gates OR2-OR7 are tied to ground. For example, the pin P116 is tied to ground and no vertical transmission through the OR gates OR4-OR7. Accordingly, the bus data signal RdBUSL0 equal to the RdBUSL1. In some embodiments, the circuit 110 selectively receives the signals from the OR gates OR1 in the bus unit circuits 100a-100b coupled to the pins P11l and P113 respectively according to the operational configurations of the circuit 110. In some embodiments, the circuit 110 does not receive signals from the buses BUSH2 and BUSH1, in some configurations of, for example, by tying the pins P111 and P113 to "0".

Figure 5:
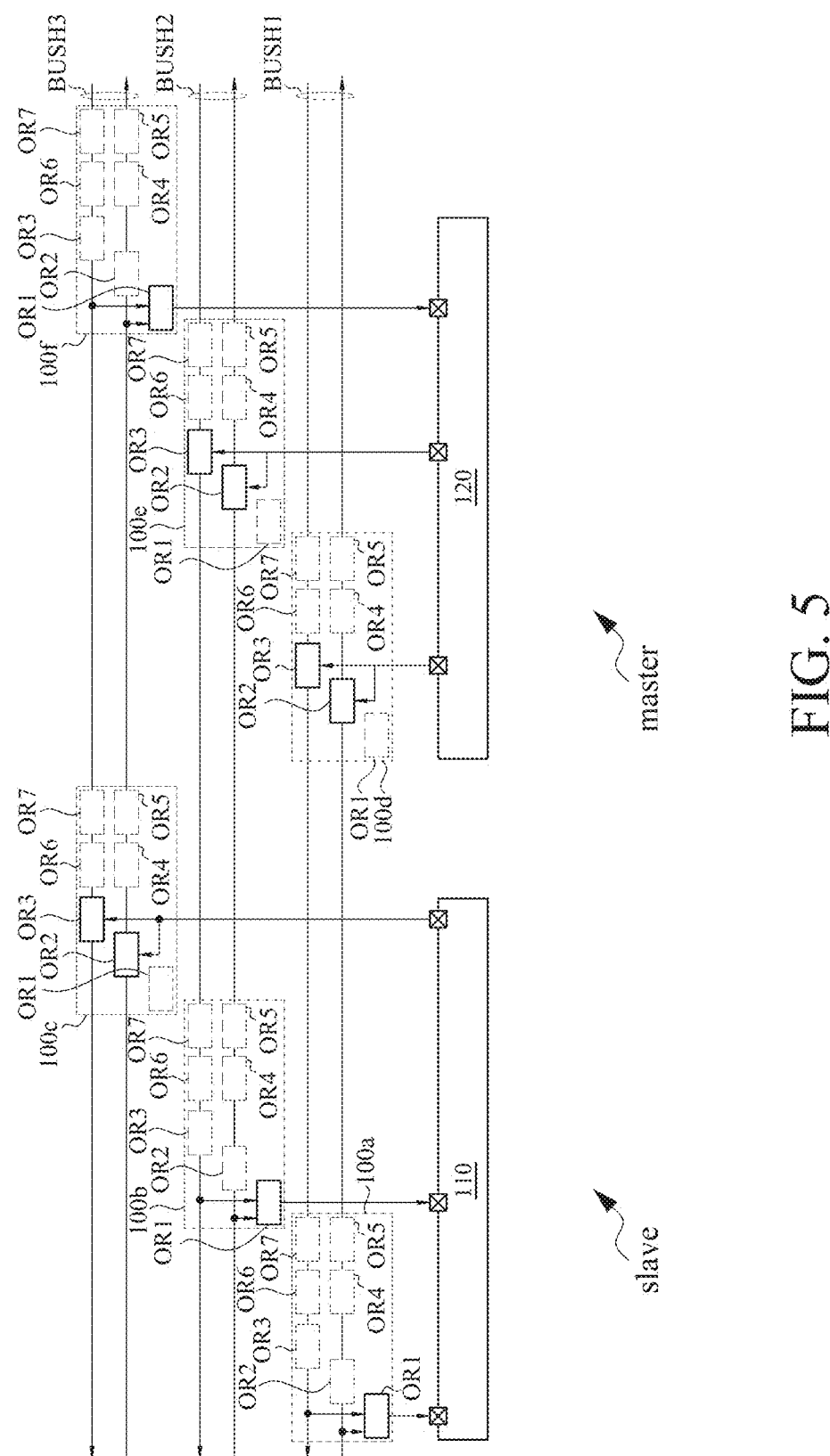
FIG. 5 is a schematic diagram of an integrated circuit, in accordance with some embodiments of the present disclosure.

Reference is now made to FIG. 5. FIG. 5 is a schematic diagram of an integrated circuit 15, in accordance with some embodiments of the present disclosure. In some embodiments, the integrated circuit 15 is configured with respect to, for example, the integrated circuit 14 in FIGS. 3-4.

Compared with the integrated circuit 14 of FIG. 4, the circuit 110 operates as the slave circuit and the circuit 120 operates as the master circuit. The configurations of master circuit and the slave circuit in FIG. 5 are similar to those in FIG. 4. Hence, the repetitious descriptions are omitted here.

Figure 6:
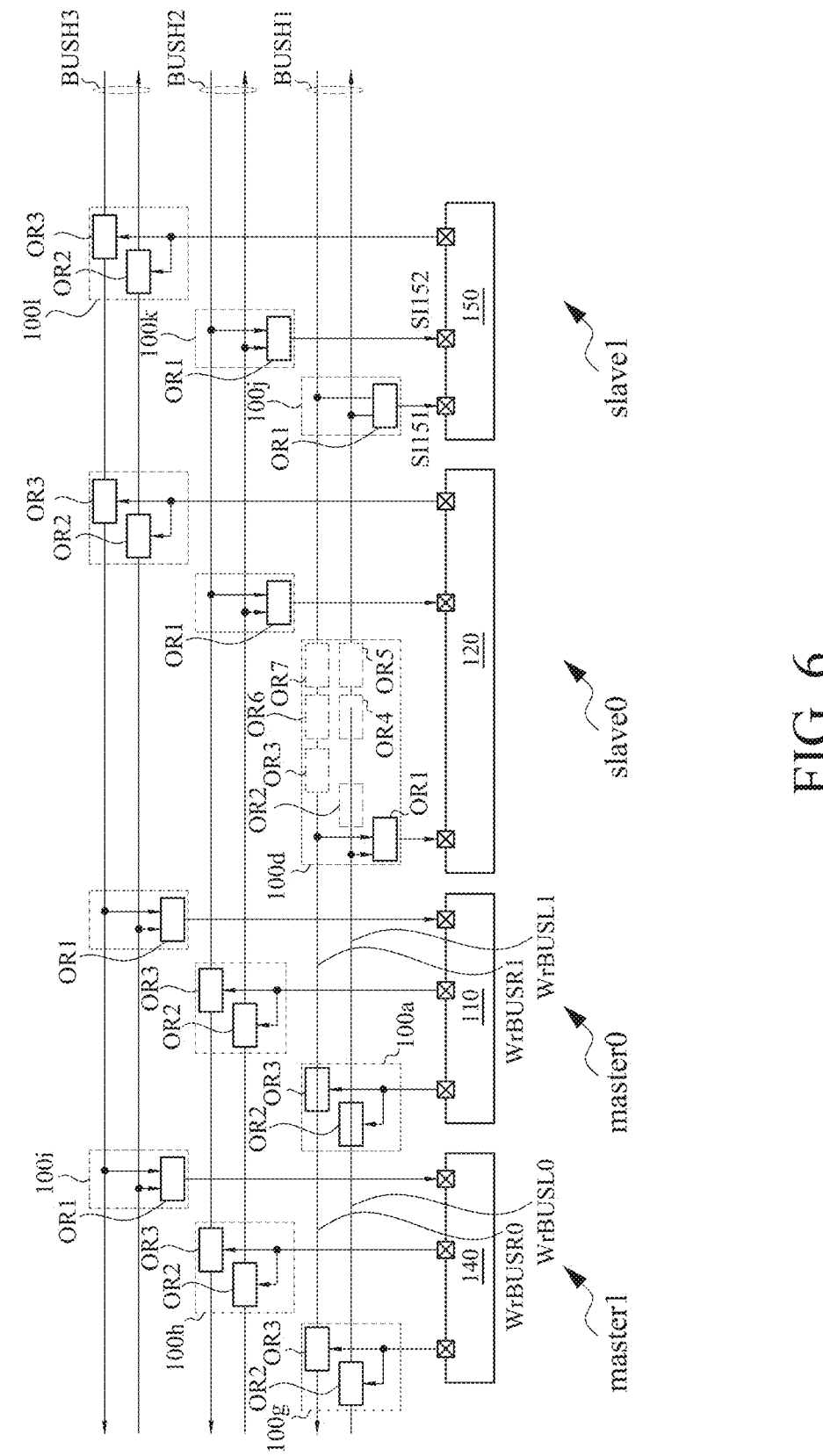
FIG. 6 is a schematic diagram of an integrated circuit, in accordance with some embodiments of the present disclosure.

Reference is now made to FIG. 6. FIG. 6 is a schematic diagram of an integrated circuit 16, in accordance with some embodiments of the present disclosure. The integrated circuit 16 is configured with respect to, for example, the integrated circuits 13-15 in FIGS. 3-5.

For illustration, the integrated circuit 16 further includes circuits 140-150 and bus unit circuits 100g-100l. In some embodiments, the bus unit circuits 100g-100l are configured with respect to, for example, the bus unit circuit 100, 100a-100f of FIGS. 1-5. With respect to the embodiments of FIGS. 1-5, like elements in FIG. 6 are designated with the same reference numbers for ease of understanding. For the sake of brevity, only operating OR gates in bold lines are shown, and the pass OR gates are omitted.

The circuit 140 is coupled to the buses BUSH1-BUSH3 through the bus unit circuits 100g-100i. The circuit 150 is coupled to the buses BUSH1-BUSH3 through the bus unit circuits 100j-100l, as shown in FIG. 6.

In some embodiments, with the master-slave protocol, the circuits 110 and 140 operate as master circuits (e.g., labeled as master0 and master1,) and the circuits 120 and 150 operate as slave circuits (e.g., labeled as slave0 and slave1.)

In some embodiments, when the circuit 110 operates as a master circuit to control the circuits 120 and 150, the bus unit circuit 100g outputs the bus data signal WrBUSL0 having the low logic value 0 on the bus BUSH1 to the bus unit circuit 100a. The configurations of the bus unit circuit 100h are similar to the bus unit circuit 100g. The configurations of the bus unit circuits 100j-100l are similar to the bus unit circuits 100d-100f. For example, the bus unit circuit 100j performs the OR operation between the bus data signal WrBUSL1 and the bus data signal WrBUSR1 on the bus BUSH1 to generate input signal SI151 to the circuit 150. Accordingly, with reference to both FIGS. 4 and 6 together, the output signal SO111 is equivalently transmitted as the input signal SI151 to the circuit 150.

The configurations of FIG. 6 are given for illustrative purposes. Various implements are within the contemplated scope of the present disclosure. For example, in some embodiments, the master-slave protocol to the circuits 110-120 and 140-150 are configured according to the practical application.

Figure 7:
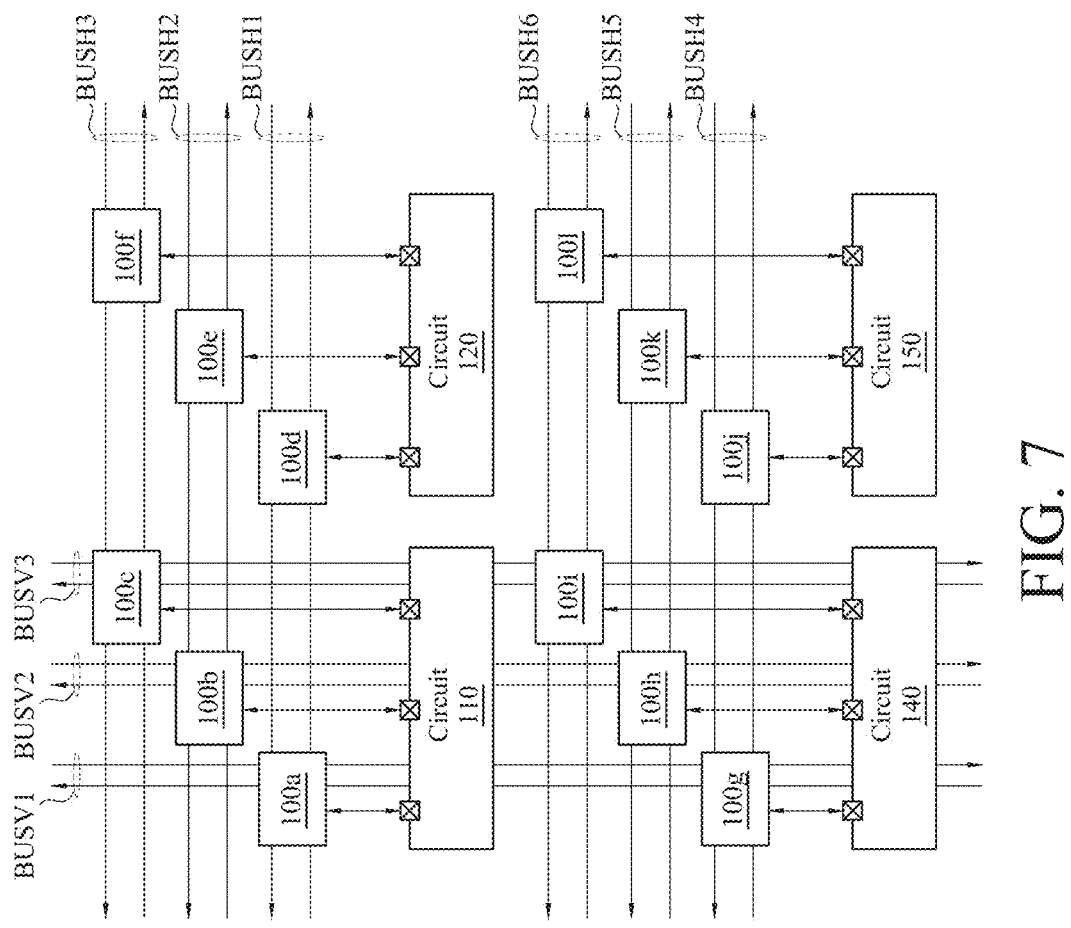
FIG. 7 is a schematic diagram of an integrated circuit, in accordance with some embodiments of the present disclosure.

Reference is now made to FIGS. 6-7, in which FIG. 7 is a schematic diagram of an integrated circuit 70, in accordance with some embodiments of the present disclosure. in some embodiments, the integrated circuit 70 is configured with respect to, for example, the integrated circuits 10, 13-16 of FIGS. 1-6.

As shown in FIG. 7, the circuits 140-150 are coupled to the buses BUSH4-BUSH6 in FIG. 7 through the bus unit circuits 100g-100l. With reference to FIG. 4, the bus BUS4 is configured with respect to the bus BUSH1 to transmit bus data signals (e.g., WrBUSL, WrBUSR,) for example, associate with write signals. The bus BUS5 is configured with respect to the bus BUSH2 to transmit bus data signals (e.g., AddrBUSL, AddrBUSR,) for example, associate with address signals. The bus BUS6 is configured with respect to the bus BUSH3 to transmit bus data signals (e.g., RdBUSL, RdBUSR,) for example, associate with read signals.

Compared with the integrated circuit 16 performing horizontal bus communication, the integrated circuit 70 performs both horizontal and vertical bus communication between the circuits 110-120 and 140-150 through horizontal buses BUSH1-BUSH6 configured with respect to the bus BUSH of FIG. 1 and vertical buses BUSV1-BUSV3 configured with respect to the bus BUSV of FIG. 1.

For example, the bus unit circuits 100a-100c and 100g-100i are configured with respect to, for example, the bus unit circuit 100 of FIG. 1 that is coupled to both the buses BUSH and BUSV. In some embodiments, the bus unit circuits 100a and 100g are coupled with each other through the bus BUSV1, and accordingly, the bus data signals on the bus BUSH1 are transmitted to/from the bus BUSH4. Similarly, the bus unit circuits 100b and 100h are coupled with each other through the bus BUSV2, and accordingly, the bus data signals on the bus BUSH2 are transmitted to/from the bus BUSH5. The bus unit circuits 100c and 100i are coupled with each other through the bus BUSV3, and accordingly, the bus data signals on the bus BUSH3 are transmitted to/from the bus BUSH6.

Figure 8:
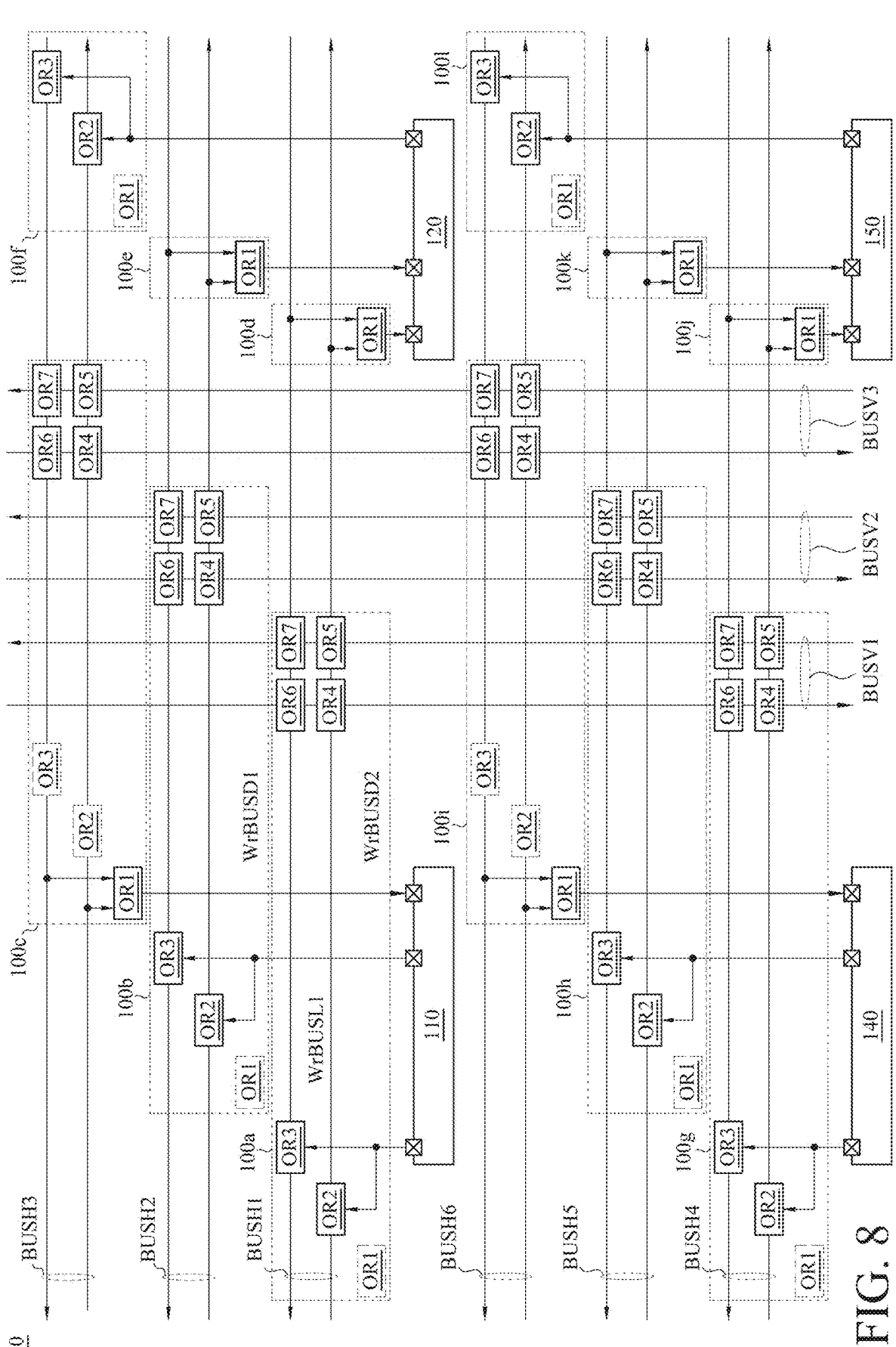
FIG. 8 is a detailed schematic diagram of the integrated circuit corresponding to FIG. 7, in accordance with some embodiments of the present disclosure.

Reference is now made to FIG. 8. FIG. 8 is a detailed schematic diagram of the integrated circuit 70 corresponding to FIG. 7, in accordance with some embodiments of the present disclosure.

In some embodiments of the master-slave protocol, the circuits 110 and 140 operate as master circuits, and the circuits 120 and 150 operates as slave circuits. When the circuit 110 is configured to control the circuits 120 and 150, the OR gates OR4-OR5 and OR6 in the bus unit circuit 100*a*-100*b* are referred to as operating OR gates to transmit corresponding signals from the OR gates OR2 thereof to the bus unit circuits 100*d*-100*e* rightward through the buses BUSH1-BUSH2 and to the bus unit circuits 100*g*-100*h* downward through the buses BUSV1-BUSV2. The OR gates OR4-OR5 of the bus unit circuits 100*g*-100*h* further transmitted signals to the bus unit circuits 100*j*-100*k* rightward through the bus BUSH4-BUSH5.

The circuit 120 feedbacks a signal to the circuit 110 through the bus unit circuit 100*f*, the bus BUSH3 and the bus unit circuit 100*c*, as shown in FIG. 8. The circuit 150 feedbacks a signal to the circuit 110 leftward and upward through the bus unit circuit 100*l*, the bus unit circuit 100*i*, the bus BUSH6, the bus BUSV3, and the bus unit circuit 100*c*.

Figure 9:
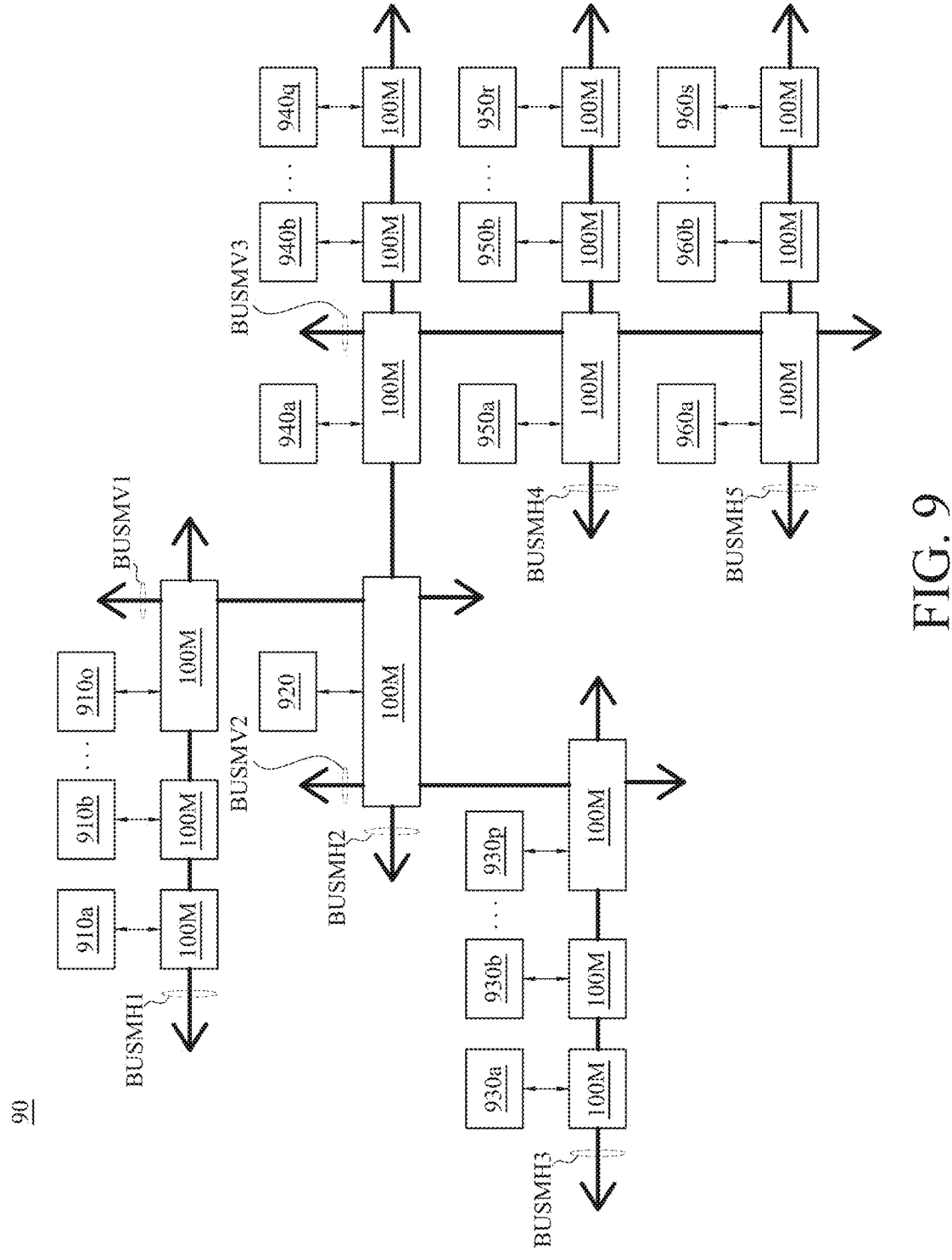
FIG. 9 is a schematic diagram of an integrated circuit, in accordance with some embodiments of the present disclosure.

Reference is now made to FIG. 9. FIG. 9 is a schematic diagram of an integrated circuit 90, in accordance with some embodiments of the present disclosure. In some embodiments, the integrated circuit 90 is configured with respect to, for example, the integrated circuits 10, 13-16, and 70 of FIGS. 1-8.

The integrated circuit 90 includes bus unit circuit groups 100M, buses BUSMV1-BUSMV3, BUSMH1-BUSMH5, and circuits 910*a*-9100, 920, 930*a*-930*p*, 940*a*-940*q*, 950*a*-950*r*, and 960*a*-960*s*, in which "o," "p," "q," "r," and "s" are positive integers.

In some embodiments, each of the buses BUSMH1-BUSMH5 includes several buses BUSH of FIG. 1, and each of the buses BUSMV1-BUSMV3 includes several buses BUSV of FIG. 1. The bus unit circuit group 100M includes multiple bus unit circuits 100. Each of the circuits 910*a*-9100, 920, 930*a*-930*p*, 940*a*-940*q*, 950*a*-950*r*, and 960*a*-960*s* is coupled to a corresponding one of the buses BUSMH1-BUSMH5 through one bus unit circuit group 100M. In some embodiments, with a master-slave protocol, the circuits 910*a*-9100, 920, 930*a*-930*p*, 940*a*-940*q*, 950*a*-950*r*, and 960*a*-960*s* are configured to perform bus communication through the buses BUSMV1-BUSMV3, BUSMH1-BUSMH5.

Furthermore, the bus unit circuit group 100M is further configured to transmit signals on the buses BUSMH1-BUSMH5 to the buses BUSMV1-BUSMV3 for vertical bus communication. For example, the bus BUSMV1 is coupled to the buses BUSMH1-BUSMH2 through two bus unit circuit groups 100M. The bus BUSMV2 is coupled to the buses BUSMH2-BUSMH3 through other two bus unit circuit groups 100M. The bus BUSMV3 is coupled to the buses BUSMH2-BUSMH5 through three bus unit circuit groups 100M.

The configurations of FIG. 9 are given for illustrative purposes. Various implements are within the contemplated scope of the present disclosure. For example, in some embodiments, the numbers of the circuits, bus unit circuit groups 100M, and the buses BUS are not limited.

Figure 10A:
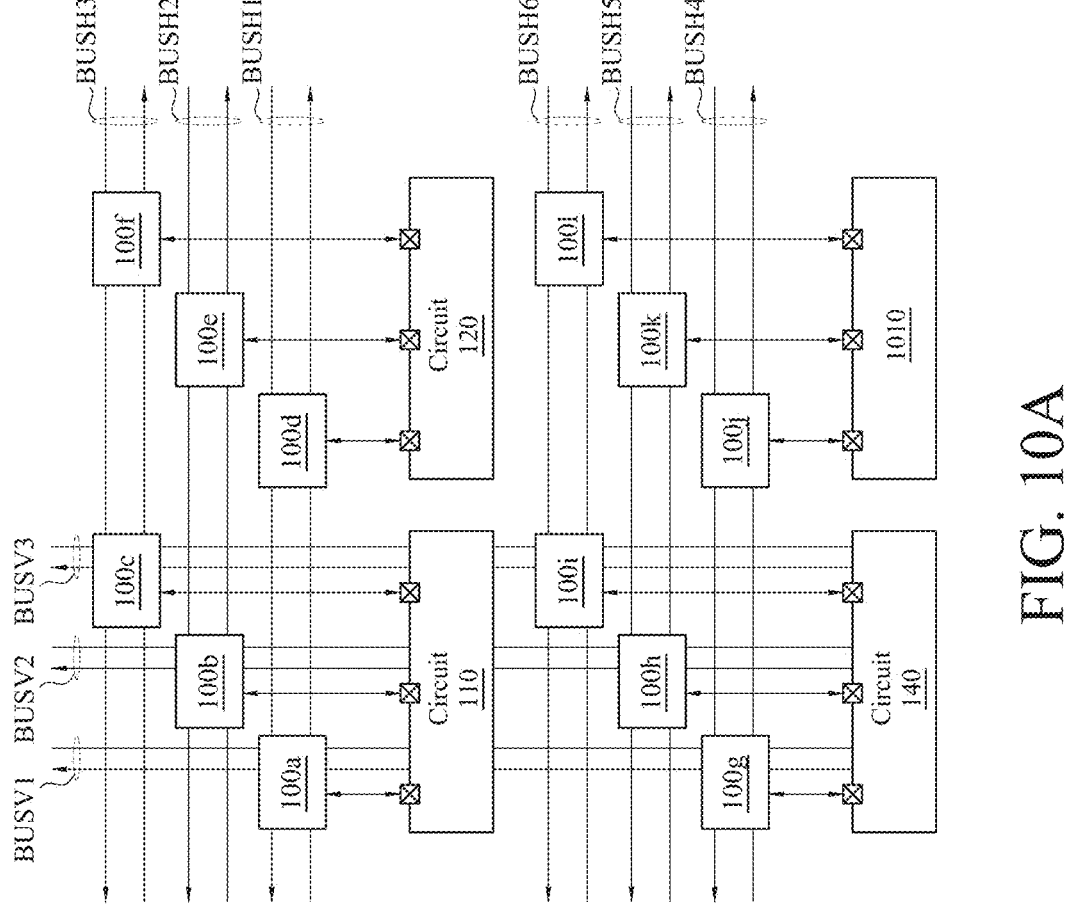
FIG. 10A is a schematic diagram of an integrated circuit, in accordance with some embodiments of the present disclosure.

Reference is now made to FIG. 10A. FIG. 10A is a schematic diagram of an integrated circuit 1001, in accordance with some embodiments of the present disclosure. In some embodiments, the integrated circuit 1001 is configured with respect to, for example, the integrated circuit 70 of FIG. 7.

Compared with FIG. 7, instead of having the circuit 150, the integrated circuit 1001 further includes a connection circuit 1010 that is coupled to the buses BUSH4-BUSH6 through the bus unit circuits 100*j*-100*l*. In some embodiments, the connection circuit 1010 includes structures, for example, metal lines and vias for passing the received signals to other device.

Figure 10B:
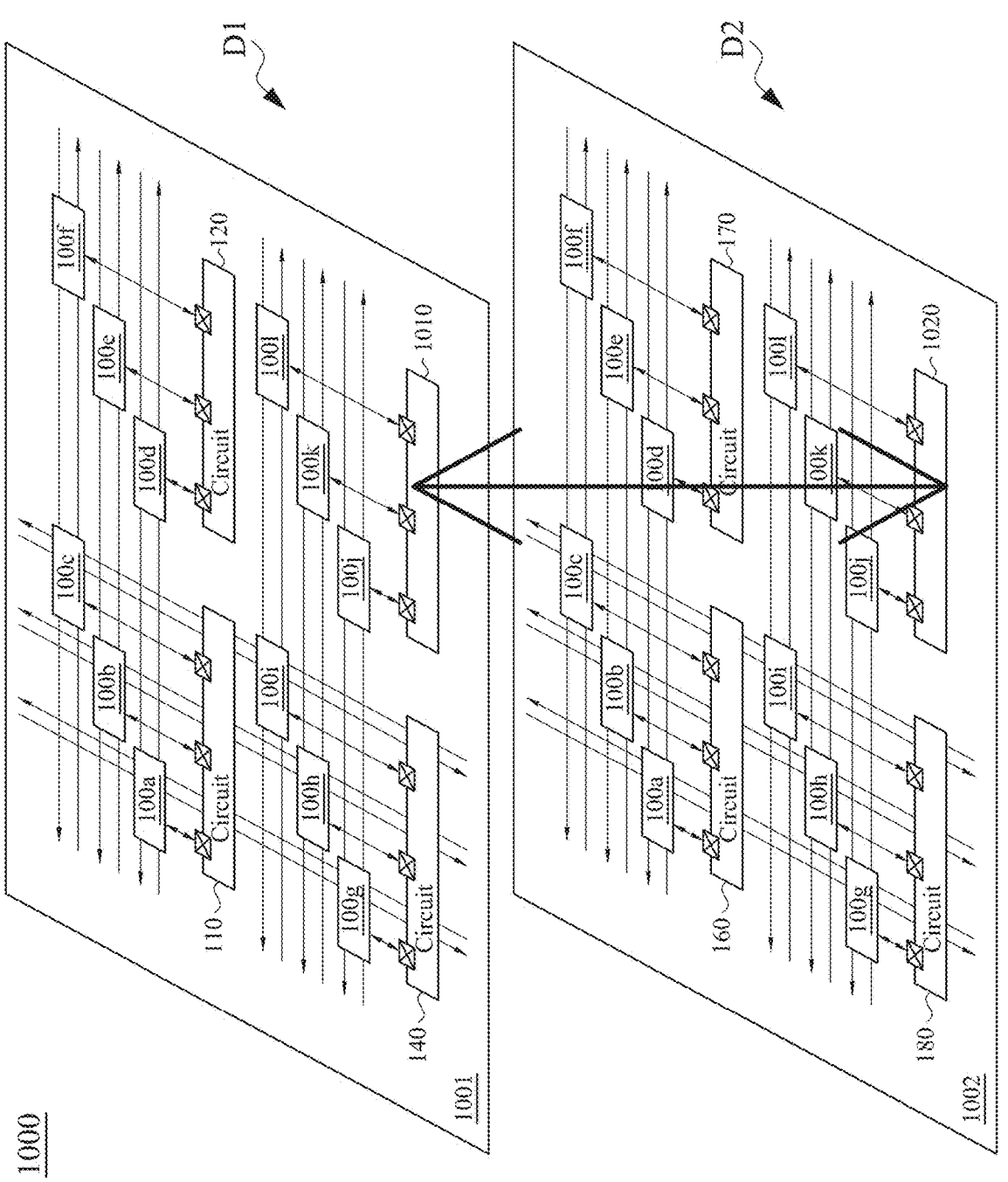
FIG. 10B is a schematic diagram of a device, in accordance with some embodiments of the present disclosure.

Reference is now made to FIG. 10B. FIG. 10B is a schematic diagram of a device 1000, in accordance with some embodiments of the present disclosure.

For illustration, the device 1000 includes the integrated circuit 1001 and an integrated circuit 1002 configured with respect to, for example, the integrated circuit 1001 of FIG. 10A. For example, the integrated circuit 1002 includes circuits 160-180 and a connection circuit 1020. The circuits 160-180 are configured with respect to, for example, the circuits 110, 120, and 140 of FIG. 10A. The connection circuit 1020 is configured with respect to, for example, the connection circuit 1010 of FIG. 10A. For example, the connection circuit 1020 that is coupled to the buses BUSH4-BUSH6 through the bus unit circuits 100*j*-100*l* in the integrated circuit 1001.

In some embodiments, two integrated circuits on two different dies are configured to operate as master and slave circuits respectively and further implemented to control one another. For example, in some embodiments, the integrated circuit 1001 is formed in a die D1, and the integrated circuit 1002 is formed in a die D2 different from the die D1. The connection circuits 1010 and 1020 are coupled with each other and configured to transmit signals between the dies D1-D2. In some embodiments, one of the integrated circuits 1001 and 1002 is configured to operate as a master circuit and the other is configured to operate as a slave circuit. Accordingly, through the configurations provided in FIG. 10B, the integrated circuit 1001 on the die D1 controls the integrated circuit 1002 on the die D2. In various embodiments, the integrated circuits 1001 and 1002 operate as slave and master circuits respectively. Accordingly, the integrated circuit 1002 on the die D2 controls the integrated circuit 1001 on the die D1.

Figure 11:
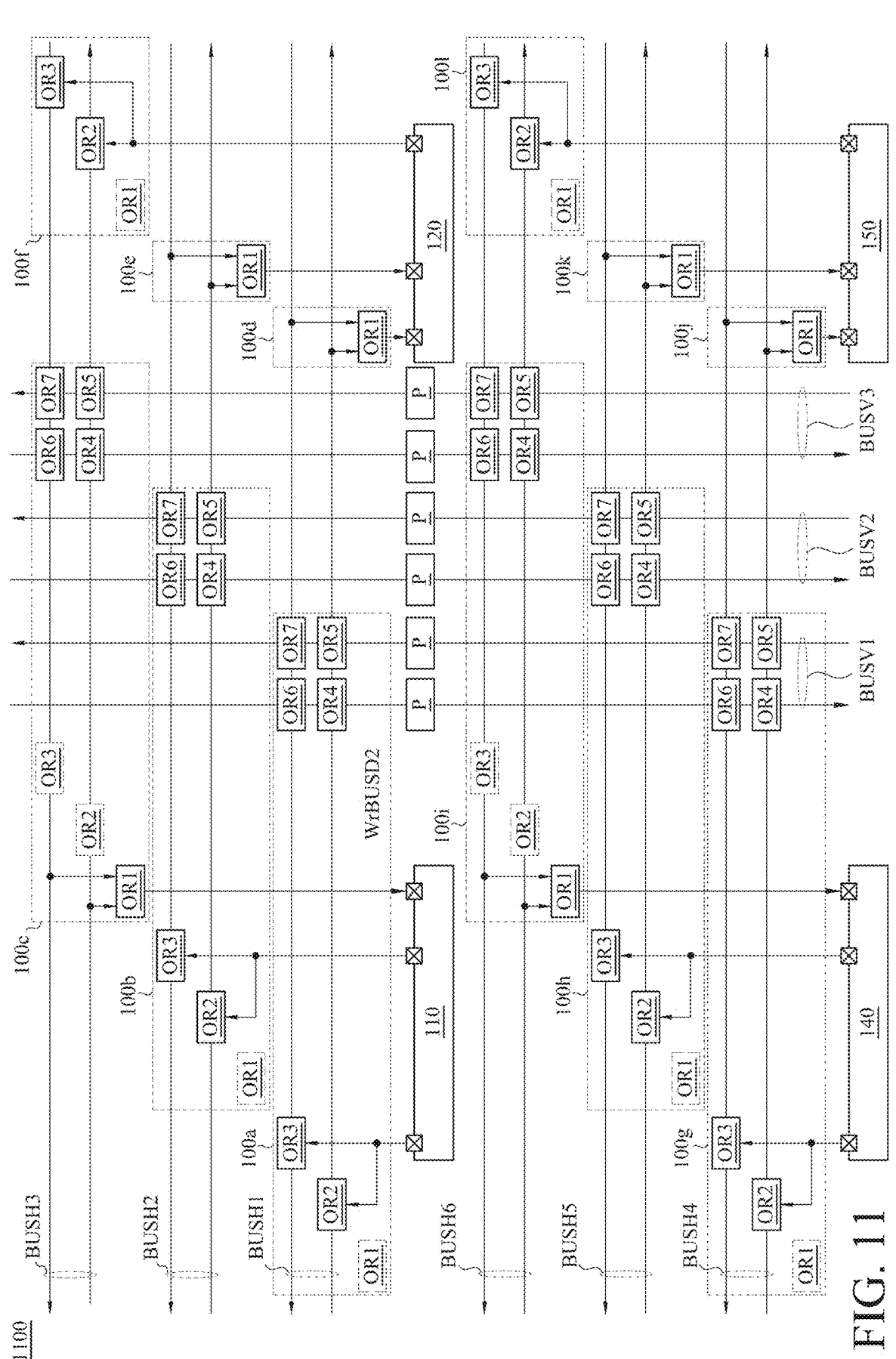
FIG. 11 is a schematic diagram of an integrated circuit, in accordance with some embodiments of the present disclosure.

Reference is now made to FIG. 11. FIG. 11 is a schematic diagram of an integrated circuit 1100, in accordance with some embodiments of the present disclosure. In some embodiments, the integrated circuit 1100 is configured with respect to, for example, the integrated circuit 70 of FIGS. 7-8.

Compared with FIG. 8, the integrated circuit 1100 includes multiple registers (e.g., pipeline) P coupled to the vertical buses BUSV1-BUSV3. For illustration, the registers P are coupled between the OR gates OR4 in the bus unit circuits 100*a*-100*c* and the OR gates OR6 in the bus unit circuits 100*g*-100*i*, and other registers P are coupled between the OR gates OR5 in the bus unit circuits 100*a*-100*c* and the OR gates OR7 in the bus unit circuits 100*g*-100*i*.

In some embodiments, the register P is configured to store data of the received signals and further to output the store data as bus data signals to next component coupled thereto. With the configurations of FIG. 11, it improves the latency of bus data signals transmitted by long distance through the buses.

The configurations of FIG. 11 are given for illustrative purposes. Various implements are within the contemplated scope of the present disclosure. For example, in some embodiments, the registers P are coupled to horizontal buses.

Reference is now made to FIG. 12. FIG. 12 is a flowchart diagram of a method 1200, in accordance with some embodiments of the present disclosure. It is understood that additional operations can be provided before, during, and after the processes shown by FIG. 12, and some of the operations described below can be replaced or eliminated, for additional embodiments of the method 1200. The order of the operations/processes may be interchangeable.

Throughout the various views and illustrative embodiments, like reference numbers are used to designate like elements. The method 1200 includes operations S1201-S1202 that are described below with reference to the integrated circuits 10, 13-16, 70, 1001, and 1100 corresponding to FIGS. 1-11.

In operation S1201, as shown in FIG. 4, the bus unit circuit 100*a* performs OR operation between the output signal SO111 from the circuit 110 and the bus data signal WrBUSL0 to generate the bus data signal WrBUSL1 on the bus BUSH1.

In S1202, the bus unit circuit 100*d* performs the OR operation between the bus data signal WrBUSL1 and the bus data signal WrBUSR1 on the bus BUSH1 to generate the input signal S121 to the circuit 120, as shown in FIG. 4. In some embodiments, the bus data signal WrBUSL1 and the bus data signal WrBUSR1 are transmitted in reverse directions (to left and to right horizontally).

In some embodiments, as shown in FIG. 8, the method 1200 further includes operations of performing, by the bus unit circuit 100*a*, OR operation between the bus data signal WrBUSL1 and the bus data signal WrBUSD1 on the bus BUSV1 to generate the bus data signal WrBUSD2 on the bus BUSV1 to the bus unit circuit 100*g* that is coupled to the bus BUSH4. In some embodiments, the bus BUSH1 and the bus BUSH4 extend in horizontal direction, and the bus BUSV1 extends in vertical direction.

In some embodiments, as shown in FIG. 11, the method 1200 further includes operations of storing, by the register P coupled to the bus BUSV1, data corresponding to the bus data signal WrBUSD2 output from the OR gate OR4 of the bus unit circuit 100*a* and transmitting, by the register P, a bus data signal according to the data to the OR gate OR6 in the bus unit circuit 100*g* that is coupled to the bus BUSH4.

Figure 13:
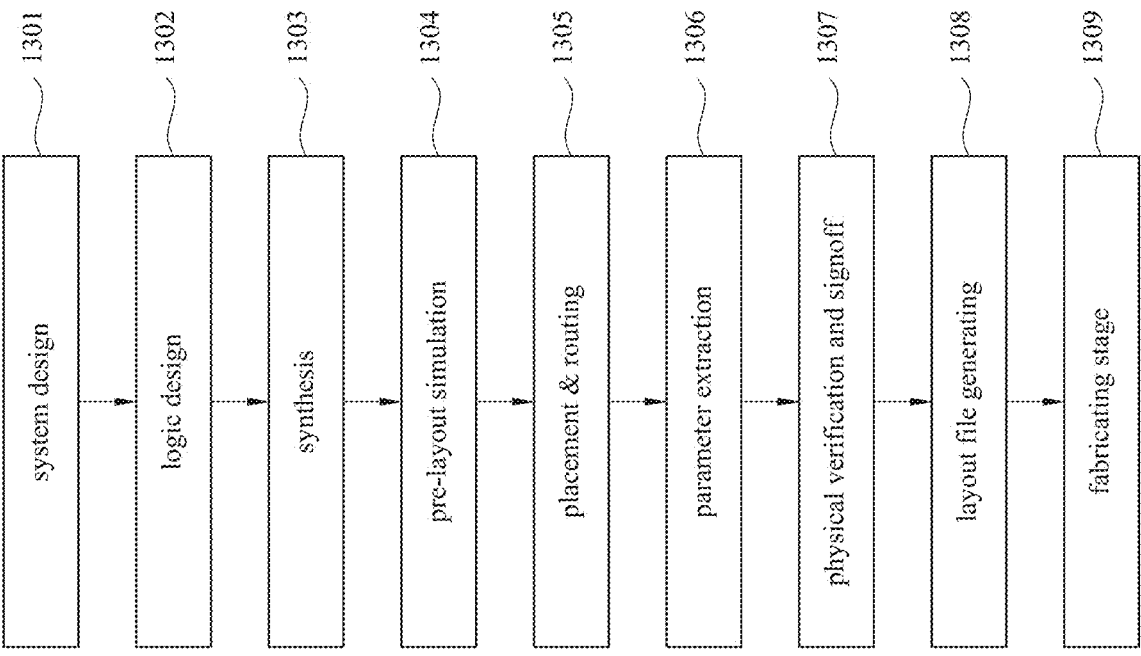
FIG. 13 is a schematic diagram illustrating a design flow, in accordance with some embodiments.

Reference is now made to FIG. 13. FIG. 13 is a schematic diagram illustrating a design flow 1300, in accordance with some embodiments. The design flow 1300, employed for designing semiconductor chips, for example, the integrated circuits 10, 13-16, 70, 1001-1002, 1100 depicted in FIGS. 1-11, utilizes one or more electronic design automation (EDA) tools to facilitate design operations. A workstation or personal computer is used in executing the tools to accomplish the design flow 1300. The design flow 1300 includes a system design stage 1301, a logic design stage 1302, a synthesis stage 1303, a pre-layout simulation stage 1304, a placement and routing stage 1305, a parameter extraction stage 1306, a physical verification and signoff stage 1307, a layout file generating stage 1308, and a fabricating stage 1309.

Initially, at the system design stage 1301, a systematic architecture for the chip of interest is provided with a high level description. In that stage, each function of the chip along with performance requirements is determined according to a design specification. Those functions are usually represented by respective schematic functional modules or blocks. In addition, an optimization or performance trade-off may be sought in order to achieve the design specification with affordable cost and power.

At the logic design stage 1302, the functional modules or blocks are described in a register transfer level (RTL) using a hardware description language. The language tools are usually available from commercial software, for example, Verilog or VHDL. For example, the bus unit circuit 100 of FIG. 1 corresponds to a module described in language tool, which provides regular patterns facilitating register transfer level coding and reduces complexity of integrated circuit design. A preliminary functionality check is performed at the logic design stage 1302 to verify if the implemented functions conform to the specification set forth in the system design stage 1301.

Subsequently, at the synthesis stage 1303, the modules in RTL descriptions are converted into a netlist data where circuit structure, for example, logic gates and registers, in each function module are established. Mapping of such logic gates and registers to available cells in a standard cell library may be conducted. Further, the netlist data is offered to describe the functional relationship of the chip devices in a gate-level. The netlist data is transformed from the gate-level view to a transistor-level view. The term "netlist" used herein refers to both graphical-based representation such as a schematic and/or a text-based representation of a circuit.

Then, the gate-level netlist data is verified at the pre-layout simulation stage 1304. At the verification process of the stage 1304, if some of the functions fail the verification in the simulation, the design flow 1300 may be paused temporarily and go back to the stages 1301 or 1302 for further correction or modification. After the pre-layout simulation stage 1304, the IC chip design has passed a preliminary verification and completed the front-end design process. Subsequently, a back-end physical design process will follow.

At the placement and routing stage 1305, a physical architecture representing the circuits determined during the front-end process is implemented. The detailed structure and associated geometry of each component and device are determined in the placement operation, and interconnects among different components are routed subsequent to the placement operation. Moreover, the placement operation involves deciding where to place each IC chip component and circuitry in a limited amount of space, and the routing operation decides the actual wiring of connecting lines. Both operations of placement and routing are performed to meet a design rule check (DRC) deck, such as from the chip manufacturing facility, so as to fulfill the manufacturing criteria of the chip. After the placement and routing stage 1305, a placed-and-routed layout data is created and a netlist with placement and routing data is generated accordingly.

At the parameter extraction stage 1306, a layout parameter extraction (LPE) operation is conducted to derive layout-dependent parameters, such as parasitic resistance and capacitance, resulting from a developed layout at the stage 1305.

At a physical verification and signoff stage 1307, layout-versus-schematic (LVS) is performed on a physical netlist generated from the design layout to ensure correspondence of the design layout to the semiconductor circuit. Further, design rule check (DRC) is performed on the design layout to ensure the design clean of, for example, electrical issues and lithographic issues for manufacturing. Incremental fixing can be performed to achieve final signoff of the IC chip design before tape-out.

In some embodiments, if the result of the physical verification and signoff stage 1307 is unfavorable, the design flow 1300 would loop back to previous stages for functionality or performance tuning. For example, the design flow 1300 may loop back to the placement and routing stage 1305 where the layout is re-developed so as to fix issues from the layout level. Alternatively, the design flow 1300 may retreat to earlier stages; either the system design stage 1301 or the logic design stage 1302 in order to recast the chip design in case the problems cannot be resolved in the back-end stage.

When the circuit design is verified and signed off, at a layout file generating stage 1308, a layout file corresponding to the circuit design is generate and described/couched in a binary file format (e.g., Graphic Database System II (GDSII) stream format), where the binary file format represents planar geometric shapes, text labels, other information. In some embodiments, the GDSII file is a graphical representation of the integrated chip that can be subsequently used for making photomasks used in the IC fabrication process. In some embodiments, the integrated circuit design layout can be expressed in any suitable format.

At a fabricating stage 1309, a fabricating tool receives the layout design file (e.g, GDSII file) corresponding to the IC chip for fabrication. In the fabricating stage 1309, a semiconductor device corresponding to the GDSII file is generated.

The design flow 1300 illustrated in FIG. 13 is exemplary. Other sequences of the stages or operations, partition of the stages, or additional stages before, between or after the stages shown still fall within the contemplated scope of the present disclosure.

In some approaches, tri-state bus structure is implemented. Nonetheless, it has fatal problems in dealing with current leakage and max operational speed. Moreover, bus floating requires special control, possible multiple drive (high current flow), and timing closure issue as elements increase and cap increase on the bus. In other application, mux-based bus has non-fixed net complexity, which linearly worsens in response increased number of counts of master and slaves on bus.

With the configurations of OR-gate based bus structure in the present application, regularity is provided by regular pattern of bus unit circuit for every master circuit and slave circuit, preventing detour issue and being easy for channel resource estimation in chip design. In addition, bus net complexity is reduced and irrelative to number of masters/slaves on the bus. The present configurations further ensures that the allowance of coupling any blocks to the bus easily and hooking up to the bus to form a new bus elements, in which signals travel around from one component (circuit) to other components (circuits) through the bus network.

Also disclosed is a device. The device includes a first bus; a first circuit and a first bus unit circuit, in which the first circuit is coupled to the first bus through the first bus unit circuit, and the first bus unit circuit is configured to pass a first output signal from the first circuit as a first bus data signal on the first bus; and a second circuit and a second bus unit circuit, wherein the second circuit is coupled to the first bus through the second bus unit circuit, and the second bus unit circuit is configured to perform an OR operation between the first bus data signal and a second bus data signal on the first bus to generate a first input signal to the second circuit.

Also disclosed is a device. The device includes a first die, including: a first circuit and a second circuit; a plurality of first buses; and a plurality of first bus unit circuits. The first circuit and the second circuit are coupled to the plurality of first buses through the plurality of first bus unit circuits. Each of the plurality of first bus unit circuits is configured to perform OR operation based on input signals on corresponding ones in the plurality of first buses coupled thereto to generate corresponding bus data signals to the first circuit and the second circuit.

Also disclosed is a method, including: performing, by a first bus unit circuit, a first OR operation between a first output signal from a master circuit and a first bus data signal to generate a second bus data signal on a first bus; and performing, by a second bus unit circuit, a second OR operation between the second bus data signal and a third bus data signal on the first bus to generate a first input signal to a slave circuit. The second bus data signal and the third bus data signal are transmitted in reverse directions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first bus;
a first circuit and a first bus unit circuit, wherein the first circuit is coupled to the first bus through the first bus unit circuit, and the first bus unit circuit is configured to pass a first output signal from the first circuit as a first bus data signal on the first bus; and
a second circuit and a second bus unit circuit, wherein the second circuit is coupled to the first bus through the second bus unit circuit, and the second bus unit circuit is configured to perform an OR operation between the first bus data signal and a second bus data signal on the first bus to generate a first input signal to the second circuit.

2. The device of claim 1, wherein the first bus unit circuit comprises:
a first OR gate configured to perform an OR operation between the first output signal and a third bus data signal having a low logic value to output the first bus data signal.

3. The device of claim 2, wherein the first bus unit circuit further comprises:
a second OR gate having a plurality of input terminals coupled to the first bus and having an output terminal coupled to a pin of the first circuit.

4. The device of claim 3, wherein the second bus unit circuit comprises:
a third OR gate, wherein a plurality of input terminals of the third OR gate are coupled to the first bus, and an output terminal of the third OR gate is configured to output the first input signal to the second circuit.

5. The device of claim 4, wherein the second bus unit circuit further comprises:
a fourth OR gate and a fifth OR gate that have input terminals coupled together at a pin of the second circuit which are tied to a ground voltage.

6. The device of claim 1, wherein is the first circuit is configured to operate as a first master component and the second circuit is configured to operate as a first slave component.

7. The device of claim 6, further comprising:
a third circuit and a third bus unit circuit coupled to the first bus, wherein the third circuit is configured to operate as a second master component, and the third bus unit circuit is configured to output a third bus data signal having a low logic value on the first bus to the first bus unit circuit.

8. The device of claim 7, further comprising:
a fourth circuit and a fourth bus unit circuit coupled to the first bus, wherein the fourth circuit is configured to operate as a second slave component, and the fourth bus unit circuit is configured to perform the OR operation between the first bus data signal and the second bus data signal on the first bus to generate a second input signal to the fourth circuit.

9. The device of claim 7, further comprising:
a fourth circuit and a fourth bus unit circuit coupled to the first bus,
wherein the second bus unit circuit comprises a plurality of OR gates that are coupled in series to the first bus and configured to pass the first bus data signal to the fourth circuit,
wherein the fourth circuit is configured to operate as a second slave component to receive a second input signal that is the same as the first bus data signal.

10. The device of claim 1, further comprising:
a second bus; and
a third bus unit circuit and a fourth bus unit circuit;
wherein the second circuit is further coupled to the second bus through the third bus unit circuit, and the third bus unit circuit is configured to pass a second output signal from the second circuit as a third bus data signal on the second bus,
wherein the first circuit is coupled to the second bus through the fourth bus unit circuit, and the fourth bus unit circuit is configured to perform an OR operation between the third bus data signal and a fourth bus data signal on the second bus to generate a second input signal to the first circuit.

11. The device of claim 10, further comprising:
a third bus; and
a fifth bus unit circuit coupled between the third bus and the first circuit and a sixth bus unit circuit coupled between the third bus and the second circuit,
wherein the fifth bus unit circuit is configured to pass a third output signal from the first circuit as a fifth bus data signal on the third bus,
wherein the sixth bus unit circuit is configured to perform an OR operation between the fifth bus data signal and a sixth bus data signal on the third bus to generate a third input signal to the second circuit.

12. The device of claim 11, further comprising:
a fourth bus,
wherein the first bus unit circuit comprises:
a logic circuit coupled to the first bus and the fourth bus, and configured to transmit the first bus data signal from the first bus to the fourth bus.

13. The device of claim 12, wherein the logic circuit comprises:
a first OR gate and a second OR gate coupled in series to a first signal line of the first bus; and
a third OR gate and a fourth OR gate coupled in series to a second signal line of the first bus,
wherein the first OR gate and the third OR gate are coupled in series to a first signal line of the fourth bus, and
the second OR gate and the fourth OR gate are coupled in series to a second signal line of the fourth bus.

14. A device, comprising:
a first die, comprising:
a first circuit and a second circuit;
a plurality of first buses; and
a plurality of first bus unit circuits, wherein the first circuit and the second circuit are coupled to the plurality of first buses through the plurality of first bus unit circuits,
wherein each of the plurality of first bus unit circuits is configured to perform OR operation based on input signals on corresponding ones in the plurality of first buses coupled thereto to generate corresponding bus data signals.

15. The device of claim 14, wherein a first portion in the plurality of first buses are configured to transmit a first portion of the bus data signals in a horizontal direction, and
a second portion in the plurality of first buses are configured to transmit a second portion of the bus data signals in a vertical direction.

16. The device of claim 14, wherein the first die further comprises:
a plurality of second bus unit circuits coupled to a portion in the plurality of first buses; and
a first connection circuit coupled to the portion in the plurality of first buses through the plurality of second bus unit circuits,
wherein the device further comprises:
a second die, comprising:
a third circuit;
a plurality of second buses coupled to the third circuit;
a plurality of third bus unit circuits coupled to the plurality of second buses; and
a second connection circuit coupled to the plurality of second buses through the plurality of third bus unit circuits,
wherein the first connection circuit and the second connection circuit are coupled to each other.

17. The device of claim 16, wherein the second circuit is configured to operate as a master circuit and the third circuit is configured to operate as a slave circuit,
wherein each the plurality of third bus unit circuits is configured to perform OR operation based on the corresponding bus data signals received through the second connection circuit from the first circuit and signals on the plurality of second buses and to generate output bus data signal to the third circuit.

18. A method, comprising:
performing, by a first bus unit circuit, a first OR operation between a first output signal from a master circuit and a first bus data signal to generate a second bus data signal on a first bus; and
performing, by a second bus unit circuit, a second OR operation between the second bus data signal and a third bus data signal on the first bus to generate a first input signal to a slave circuit,
wherein the second bus data signal and the third bus data signal are transmitted in reverse directions.

19. The method of claim 18, further comprising:
performing, by the first bus unit circuit, a second OR operation between the second bus data signal and a fourth bus data signal on a second bus to generate a fifth bus data signal on the second bus to a third bus unit circuit that is coupled to a third bus,
wherein the first bus and the third bus extend in a first direction, and the second bus extends in a second direction different from the first direction.

20. The method of claim 18, further comprising:
performing, by the first bus unit circuit, a second OR operation between the second bus data signal and a fourth bus data signal on a second bus to generate a fifth bus data signal on the second bus;
storing, by a register coupled to the second bus, data corresponding to the fifth bus data signal; and transmitting, by the register, a sixth bus data signal according to the data to a third unit circuit that is coupled to a third bus.

* * * * *